March 30, 1965 D. BRAY 3,176,235
NEGATIVE FEEDBACK TRANSISTOR AMPLIFIER CIRCUITS
Filed June 6, 1962
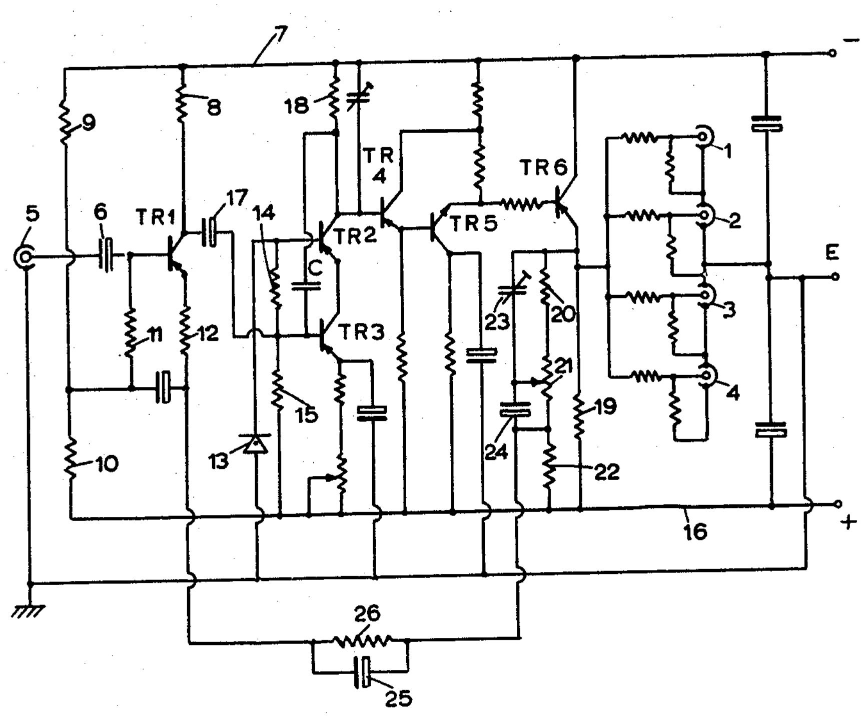

United States Patent Office 3,176,235

Patented Mar. 30, 1965

3,176,235

NEGATIVE FEEDBACK TRANSISTOR AMPLIFIER CIRCUITS

Derek Bray, Uxbridge, England, assignor to Electric & Musical Industries Limited, Hayes, England, a company of Great Britain Filed June 6, 1962, Ser. No. 200,514
Claims priority, application Great Britain, June 9, 1961, 20,858/61
6 Claims. (Cl. 330—18)

The present invention relates to transistor circuits and has particular, but not exclusive, reference to transistor multi-stage feedback amplifiers.

In certain circuits it is desirable to have a relatively long time constant present, and in thermionic valve circuits it is frequently advantageous to make use of so-called "Miller" capacity as one of the time constant determining components in the circuit.

In equivalent transistor circuits a problem arises in that the collector to base capacity of a transistor which may be considered as a factor of the Miller capacity varies with the collector to base voltage of the transistor. Clearly the presence of this variable capacity will result in variations of the time constant of any circuit in which it is incorporated which in many cases can be a serious disadvantage, e.g., the introduction of differential phase distortion in an encoded N.T.S.C. television video signal.

One object of the present invention is to reduce this disadvantage.

In accordance with the present invention, an electrical circuit is provided, comprising a transistor in common emitter arrangement having its collector electrode connected to the emitter of a second transistor in common base arrangement, and a capacitor connected from the collector of said second transistor to the base of the first transistor, thereby to provide a capacity from the base of the first transistor to the collector of the second transistor.

A particular circuit in which the aforementioned disadvantage arises is that of a transistor multi-stage feedback amplifier. In such an amplifier it is desirable to maintain a predetermined relationship between the time constants included in the feedback loop, since the time constants have a direct influence on the frequency response and stability of the amplifier. However, in such an amplifier, the variations in the Miller capacity of any stage which has a substantial voltage gain, and there will usually be one of such stage at least, may be sufficient to introduce undesirable phase shift effects at different signal amplitudes.

Therefore, it is another object of the present invention to provide an improved multi-stage negative feedback amplifier in which such undesirable phase shift effects are at least substantially reduced.

According to another aspect of the present invention there is provided a multi-stage negative feedback transistor amplifier, which includes in the signal path a stage which comprises a transistor in common emitter arrangement having its collector electrode connected to the emitter of a second transistor in common base arrangement, and a capacitor connected to the collector of said second transistor, whereby a time constant is provided in the negative feedback loop which is substantially unaffected by variations of the collector-to-base capacities of said transistors, which variations are liable to occur in response to variations in the signals being amplified.

Preferably, the capacitor referred to in the preceding paragraph is connected from the collector of the second transistor to the base of the first transistor so as to take advantage of the Miller effect to increase the effective value of the capacity compared with its actual value. It will be appreciated that the particular stage of the amplifier under consideration may be a stage of relatively high voltage gain, so that it may be used to provide a time constant which is large compared with the time constant of any other stage or stages of the amplifier. In a multi-stage negative feedback amplifier it is usually desirable that one of the time constants in the feedback loop should be large compared with the others to ensure stability at high frequencies.

Further objects of the present invention will become apparent from the following description and accompanying drawing, the single figure of which shows the circuit diagram of a distribution amplifier including a transistor stage in accordance with one embodiment of the present invention.

The amplifier illustrated is intended for the distribution of a television video waveform to a group of output channels, represented by co-axial leads 1 to 4, from an input co-axial lead 5. Parts of the amplifier are conventional and will not be described in detail. The waveform from the lead 5 is applied to the first stage of the amplifier which comprises a transistor TR1, the base of the transistor being connected to the inner conductor of the lead 5 by a blocking condenser 6. The transistor has its collector connected to the negative supply line 7 by way of a load resistor 8. The resistors 9 to 12 determine the D.C. conditions for the transistor TR1, and as will appear the emitter receives negative feedback signals from the final stage of the amplifier. The second stage of the amplifier comprises two transistors TR2 and TR3, the base of TR3 being connected to the collector of TR1 by the capacitor 17. The transistor TR3 is connected in common emitter arrangement, the transistor TR2 is connected in common base arrangement, and the collector of TR3 is connected to the emitter of TR2. A potential dividing chain consisting of the Zener diode 13 and the resistors 14 and 15 is connected as shown from the positive voltage line 16 to ground, and the base of TR3 is connected to the junction of 14 and 15 whilst the base of TR2 is connected to the junction of 14 and 13. The base of TR2 is thus maintained at a fixed potential. The load resistor for the second stage comprises the resistor 18, which is of relatively large value to provide a substantial voltage gain for the stage, and the collector of TR2 is connected to the base of TR3 by the capacity C. The output stage of the amplifier is substantially conventional and comprises the transistors TR4 to TR6 which are connected in emitter follower arrangement. The transistors TR4 and TR5 are of opposite conductivity types and the output stages are arranged to provide appropriate impedance transformation from the collector of TR2 to the channels 1 to 4. Negative feedback stabilises the gain of the amplifier and causes it to operate at a very low output impedance, the negative feedback being taken from the combination of resistors 19 to 22 in the emitter lead of the transistor TR6 and being applied by the path formed by the capacitors 23, 24 and 25 and resistor 26 to the emitter of TR1.

As the transistors TR1 and TR3 are arranged in what is the equivalent of a thermionic valve cascade circuit, TR3 provides current gain without any voltage gain and hence the Miller capacity has very little effect on the current gain. TR2 is a grounded base stage giving voltage gain without current gain so that the collector-to-base capacity acts only as a shunt capacity between the collector and the point of earth potential E and does not introduce any negative feedback. In order to ensure that this stage will introduce the low frequency cut-off required in the feedback loop, to prevent oscillation, the capacitor C is connected between the base of TR3 and the collector of TR2, the value of the capacity being determined by the frequency response and stability requirements. The same effect could have been obtained by a larger capacitor between the collector of TR2 and earth but this would require larger capacitive currents at high frequencies and hence a higher power transistor. Thus, a stage is produced having the same frequency response characteristic as a conventional grounded emitter stage but replacing the variable Miller capacity of that stage by a capacity which is substantially independent of signal amplitude thus removing the main source of differential phase in the amplifier.

From the foregoing remarks it can be seen that this invention is in no way restricted to distribution amplifiers or indeed to transistor feedback amplifiers where it is necessary to keep differential phase distortion down to low levels while at the same time introducing a time constant with a low frequency cut-off into the feedback circuit, but it may be applied to any transistor circuit where the effects of variable Miller capacity are desired to be minimized. For example, a stage like the second stage of the amplifier illustrated may be used as a Miller integrator.

What I claim is:

1. An electrical circuit comprising first and second transistors and a capacitor, said first transistor being connected in common emitter arrangement having its collector electrode connected to the emitter of said second transistor, said second transistor being connected in common base arrangement, means for maintaining the base of said second transistor at a fixed potential, means for connecting one side of said capacitor to the base of said first transistor, a source of a varying signal, and means connecting said source to the base of said first transistor, a load impedance connected to the collector of said second transistor and means for deriving therefrom a signal having substantially the same phase as the signal at the collector of the second transistor and for applying said signal to the other side of said capacitor without introducing a substantial change of phase in said signal.

2. A transistor amplifier comprising a plurality of amplifying stages constituting a forward signal path and a negative feedback path from the output of said forward signal path to the input of said forward signal path, said amplifier having a time constant, one of said stages comprising first and second transistors and a capacitor, said first transistor being connected in common emitter arrangement, said second transistor being connected in common base arrangement, the collector electrode of said first transistor being connected to the emitter of said second transistor, said capacitor being connected from the collector of said second transistor to the base of said first transistor, whereby said time constant is substantially unaffected by variations of the collector-to-base capacities of said first and second transistors.

3. An amplifier according to claim 2 wherein said one stage is followed in said forward path by an emitter-follower stage, the output of said forward signal path being taken from said emitter follower stage.

4. An amplifier according to claim 2 wherein said one stage is followed by more than one emitter follower stage in said forward signal path, the output of said forward signal path being taken from the last of said emitter-follower stages.

5. An amplifier according to claim 2, in which said one stage has a large time constant compared with any other of said stages.

6. An amplifier according to claim 5, wherein said one stage is an intermediate stage in said forward path.

References Cited by the Examiner

UNITED STATES PATENTS

| | | | |
|---|---|---|---|
| 2,692,919 | 10/54 | Cohen | 330—158 XR |
| 2,760,007 | 8/56 | Lozier | 330—20 XR |

FOREIGN PATENTS

| | | |
|---|---|---|
| 567,580 | 12/58 | Canada. |

ROY LAKE, *Primary Examiner.*